(12) United States Patent
Sharma et al.

(10) Patent No.: US 7,003,966 B2
(45) Date of Patent: Feb. 28, 2006

(54) ENERGY CONSUMPTION REDUCTION IN A MULTI-EFFECT ABSORPTION SYSTEM

(75) Inventors: Ratnesh K. Sharma, Union City, CA (US); Cullen E. Bash, San Francisco, CA (US); Chandrakant D. Patel, Fremont, CA (US); Cyril Brignone, Mountain View, CA (US)

(73) Assignee: Hewlett Packard Development Company, L.P., Houston, TX (US)

(*) Notice: Subject to any disclaimer, the term of this patent is extended or adjusted under 35 U.S.C. 154(b) by 89 days.

(21) Appl. No.: 10/739,037

(22) Filed: Dec. 19, 2003

(65) Prior Publication Data

US 2005/0132724 A1    Jun. 23, 2005

(51) Int. Cl.
*F25B 15/00* (2006.01)

(52) U.S. Cl. .......................... 62/101; 62/476

(58) Field of Classification Search .............. 62/101, 62/141, 476, 478

See application file for complete search history.

(56) References Cited

U.S. PATENT DOCUMENTS

| | | | | |
|---|---|---|---|---|
| 4,531,374 A | * | 7/1985 | Alefeld | 62/79 |
| 5,205,136 A | * | 4/1993 | DeVault et al. | 62/476 |
| 5,390,509 A | * | 2/1995 | Rockenfeller et al. | 62/476 |
| 5,575,156 A | * | 11/1996 | Howe | 62/101 |
| 5,718,628 A | * | 2/1998 | Nakazato et al. | 454/184 |
| 5,727,397 A | * | 3/1998 | He | 62/476 |
| 5,931,007 A | * | 8/1999 | Sgamboti et al. | 62/101 |
| 6,374,627 B1 | * | 4/2002 | Schumacher et al. | 62/259.2 |
| 6,412,292 B1 | * | 7/2002 | Spinazzola et al. | 62/89 |

* cited by examiner

*Primary Examiner*—Melvin Jones
(74) *Attorney, Agent, or Firm*—Richard P. Lange

(57) ABSTRACT

A method of reducing energy consumption in a multi-effect absorption system. The multi-effect absorption system includes a primary generator for a primary desorption process and a secondary generator for a secondary desorption process. In the method, heat is provided to the primary generator from a primary heat source for the primary desorption process. Heat generating devices are cooled with the multi-effect absorption system while the generated heat is collected and transferred to the to the secondary generator for use in the secondary desorption process thereby reducing the amount of heat required from the primary heat source and reducing the energy consumption of the absorption system.

33 Claims, 9 Drawing Sheets

ENERGY CONSUMPTION REDUCTION IN A MULTI-EFFECT ABSORPTION SYSTEM

BACKGROUND OF THE INVENTION

An absorption cooling system provides a method of cooling using a primary heat source as a primary energy source. Absorption systems function in a similar manner to vapor compression systems. However, instead of using a compressor to compress refrigerant and supply the refrigerant to a condenser, absorption systems use a solution circuit. A solution circuit consists of an absorber and a generator (also known as a desorber) supplied with an absorbent. The absorbent absorbs the refrigerant in the absorber and desorbs the refrigerant in the generator, thus bringing the refrigerant from a low pressure, low temperature state to a high pressure, high temperature state. The generator then supplies the refrigerant to a condenser. Heat from a heat source is supplied to the generator during the desorbing process.

Multi-effect absorptions systems function in a similar manner to the basic single effect absorption system. However, they include at least a two generators and either an additional absorber, an additional condenser or both. Multi-effect absorption systems are more efficient than single effect absorption systems because they use dissipated heat from the additional absorber, additional condenser or both and apply that heat to one of the generators for use during the desorbing process. Absorption systems, both single-effect and multi-effect, may be implemented to cool rooms or data centers.

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of systems, e.g., about forty (40) systems, with future configurations of racks being designed to accommodate up to eighty (80) systems. The systems typically include a number of components, e.g., processors, microcontrollers, high speed video cards, memories, semi-conductor devices, and the like, that dissipate relatively significant amounts of heat during the operation of the respective components. For example, a typical system comprising multiple microprocessors may dissipate approximately 250 W of power. Thus, a rack containing forty (40) systems of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

In a similar manner to the compressors above, generators of an absorption system require a minimum amount of heating to provide a required cooling capacity to sufficiently cool the room or data center. Generally, heat input to the generator is not varied according to the distribution needs of the data center or according to its operating efficiency.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause their temperatures to exceed a predetermined temperature range. In addition, conventional return systems remove air from the data centers in an indiscriminate manner. That is, conventional return systems may remove relatively cool air from data centers and/or may not efficiently remove relatively warm air from data centers. Consequently, conventional cooling systems often incur greater amounts of operating expenses than may be necessary to sufficiently cool the heat generating components contained in the racks of data centers.

SUMMARY OF THE INVENTION

In accordance with an embodiment, the invention pertains to a method of reducing energy consumption in a multi-effect absorption system. The multi-effect absorption system includes a primary generator for a primary desorption process and a secondary generator for a secondary desorption process. In the method, heat is provided to the primary generator from a primary heat source for the primary desorption process. Heat generating devices are cooled with cooling fluid supplied by the multi-effect absorption system while the generated heat is collected and transferred to the to the secondary generator for use in the secondary desorption process thereby reducing the amount of heat required from the primary heat source and reducing the energy consumption of the absorption system.

BRIEF DESCRIPTION OF THE DRAWINGS

Embodiments of the invention are illustrated by way of example and not limitation in the accompanying figures in which like numeral references refer to like elements, and wherein.

DETAILED DESCRIPTION OF THE INVENTION

Figure 1:
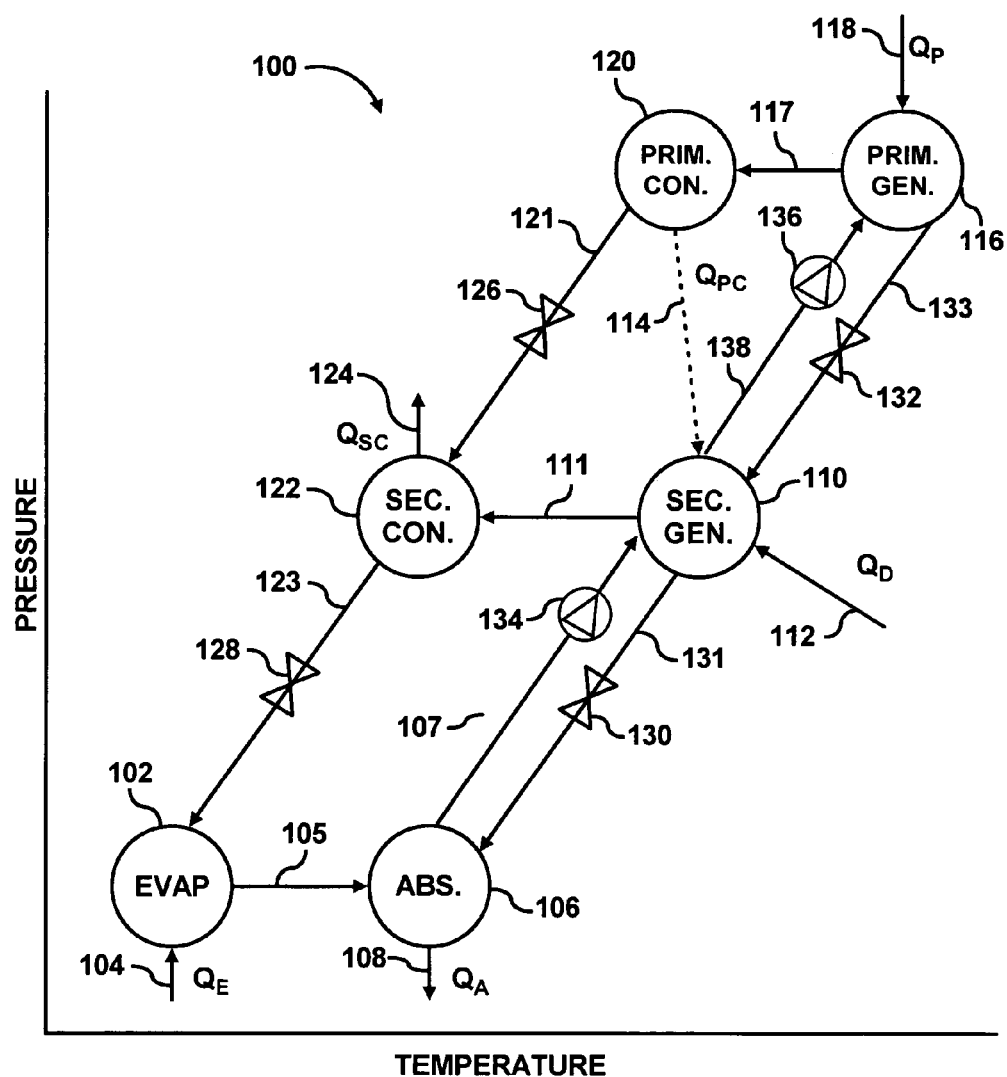
FIG. 1 shows a simplified model of an absorption system in accordance with an embodiment of the invention.

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structures have not been described in detail so as not to unnecessarily obscure the invention.

Throughout the present disclosure, reference is made to "cooling fluid" and "heated cooling fluid". For purposes of simplicity, "cooling fluid" may generally be defined as air that has been cooled by a cooling device, e.g., an air conditioning unit. In addition, "heated cooling fluid" may generally be defined as cooling fluid that has been heated. It should be readily apparent, however, that the terms "cooling fluid" are not intended to denote air that only contains cooled fluid and that "heated cooling fluid" only contains cooling fluid that has been heated. Instead, embodiments of the invention may operate with air that contains a mixture of heated cooling fluid and cooling fluid. In addition, cooling fluid and heated cooling fluid may denote gases other than air, e.g., refrigerant and other types of gases known to those of ordinary skill in the art that may be used to cool electronic components.

According to an embodiment of the invention, a multi-effect absorption system is configured to cool one or more heat generating devices. The heat generating device(s) may be located in racks in a room, e.g., a data center. The multi-effect absorption system cools the heat generating device(s) by supplying cooling fluid (e.g., air, other gasses, liquid, etc.) and controlling the flow of cooling fluid to and/or from the heat generating device(s). When used in conjunction with a room of heat generating device(s), an additional system may be provided to control the amount of cooling fluid delivered to each rack or heat generating device. In one respect, by substantially increasing the cooling fluid flow to and/or from those racks dissipating greater amounts of heat and by substantially decreasing the cooling fluid flow to and/or from those racks dissipating lesser amounts of heat, the amount of energy required to operate the cooling system may be relatively reduced. This is generally referred to as smart cooling. A more detailed description of smart cooling may be found in U.S. Pat. No. 6,574,104, issued Jun. 3, 2003 to Patel et al., and is assigned to the assignee of the present invention and is incorporated by reference herein in its entirety.

According to embodiments of the invention, additional efficiency in cooling the heat generating devices in the room may be achieved through implementation of a multi-effect absorption system configured to collect heat from the heat generating devices and to utilize the collected heat as part of the absorption system.

The multi-effect absorption system employable with embodiments of the invention may be configured in several ways. As an example, the multi-effect absorption system may be configured as a double-effect double-condenser absorption system having at least a primary generator, a secondary generator, a primary condenser and a primary heat source. The primary generator receives heat from the primary heat source and that heat is used to provide energy to the primary generator. In a typical multi-effect absorption system, the secondary generator receives heat from the primary generator, thus increasing efficiency. That is, the dissipated heat from the primary condenser is supplied to the secondary generator, thereby reducing the amount of heat required from the primary heat source. According to embodiments of the invention, heat is collected from the heat generating device(s) and supplied to the secondary generator, to further increase efficiency. In one regard, through use of the heat collected from the heat generating device(s) to provide energy to the secondary generator, the amount of heat supplied to the primary generator may be relatively reduced.

As another example, the multi-effect absorption system may be configured as a double-effect double-absorber absorption system having at least a primary generator, a secondary generator, a primary absorber and a primary heat source. In this system, as in the previous system, the primary generator receives heat from the primary heat source and that heat is used to provide energy to the primary generator. The secondary generator receives heat from the primary absorber and that heat is employed to provide energy to the secondary generator, thus increasing efficiency. That is, dissipated heat from the primary absorber is supplied to the secondary generator, thereby reducing the amount of heat required from the primary heat source. According to embodiments of the invention, heat is collected from the heat generating device(s) and supplied to the secondary generator to further increase efficiency. In one respect, through use of the heat collected from the heat generating device(s) to provide energy to the secondary generator, the amount of heat supplied to the primary generator may be relatively reduced.

As another example, the multi-effect absorption system may be configured as a triple-effect absorption system having at least a primary generator, a secondary generator, a primary absorber, a primary condenser and a primary heat source. In this system, as in the previous systems, the primary generator receives heat from the primary heat source and that heat is used to provide energy to the primary generator. The secondary generator receives heat from the primary absorber and the primary condenser and that heat is employed to provide energy to the secondary generator, thus increasing efficiency. That is, dissipated heat from the primary absorber and the primary condenser is supplied to the secondary generator, thereby reducing the amount of heat supplied to the primary generator from the primary heat source. According to embodiments of the invention, heat is collected from the heat generating device(s) and supplied to the secondary generator to further increase efficiency. In one respect, through use of the heat collected from the heat generating device(s) to provide energy to the secondary generator, the amount of heat supplied to the primary generator may be relatively reduced.

In any of the above examples, the multi-effect absorption system may be configured to collect heat from the heat generating device(s) in a variety of manners. By way of example, the multi-effect absorption system cools a room having at least one rack of heat generating devices. A fan forces cooling fluid through a floor plenum and into the room. The cooling fluid circulates through the racks and into a vent to a ceiling plenum. A fan pulls the now heated cooling fluid through the plenum and routes it to a heat exchanger for cooling by the multi-effect absorption system. In addition, some of the heated cooling fluid is directed to the secondary generator for use in the desorption process. A duct may connect one or more of the racks to the ceiling plenum. Through use of the duct, the quality of heat collected may be enhanced by substantially restricting recirculation of the cooling fluid into the heated cooling fluid. This in turn increases the exergy of the fluid thereby easing the extraction of heat through the heat exchanger. Alternatively, an individual duct may connect at least one device in at least one rack to a collection fan. In this example, additional fans in at least one duct may be controlled by the control system for increasing the heat collected from the heat generating device associated with that duct.

Through implementation of embodiments of the invention, the amount of heat supplied to the primary generator may be substantially reduced in comparison with known systems. In one regard, reducing the amount of heat supplied to the primary generator results in an energy savings as well as cost savings because the amount of heat and therefore the costs associated with supplying the primary generator with heat may be substantially reduced.

With reference first to FIG. 1, there is shown a simplified model of a multi-effect absorption system 100 according to an embodiment of the invention. The multi-effect absorption system 100 illustrated in FIG. 1 is a double-effect double-condenser absorption system and includes an evaporator 102, an absorber 106, a secondary generator 110, a primary generator 116, a primary condenser 120 and a secondary condenser 120. In general, absorption systems use a refrigerant and an absorbent. For example, an absorption system may use an ammonia/water combination, a water/lithium bromide combination, and the like. The refrigerant vaporizes in the evaporator 102 thereby absorbing heat $Q_E$ 104 from, for instance, cooling fluid heated by one or more heat generating devices. The vaporized refrigerant flows to the absorber 106, as indicated by the arrow 105, and the vaporized refrigerant is absorbed into the absorbent contained in the absorber 106, thereby dissipating heat $Q_A$ 108.

The absorbent and the absorbed refrigerant flow through the secondary generator 110 through operation of a pump 134 and then to the primary generator 116 through operation of a pump 136, as indicated by the arrows 138 and 107 respectively. Alternatively, the absorbent and the absorbed refrigerant may flow to the primary generator 116 directly through operation of a pump and direct line (not shown). Heat $Q_P$ 118 is supplied into the primary generator 116 from a primary heat source (not shown) and the heat $Q_P$ 118 desorbs some of the vaporized refrigerant from the absorbent in the primary generator 116. The primary heat source may comprise flue gases from thermal power plants, process plants, or any 100° C.–200° C. heat source, for example geothermal vents. The desorbed refrigerant flows to the primary condenser 120, as indicated by the arrow 117, which condenses the refrigerant and dissipates heat $Q_{PC}$ 114. The condensed refrigerant flows from the primary condenser 120 to the secondary condenser 122 through a valve 126, as indicated by the arrow 121.

The absorbent with the remainder of the absorbed refrigerant then flows from the primary generator 116 to the secondary generator 110 through a valve 132, as indicated by the arrow 133. Heat $Q_{PC}$ 114 dissipated from the desorbed refrigerant is supplied from the primary condenser 120 to the secondary generator 110. In addition, heat $Q_D$ 112 collected from the heat generating device(s) is also supplied to the secondary generator 110. The heat $Q_{PC}$ 114 and $Q_D$ 112 desorbs additional refrigerant from the absorbent in the secondary generator 110. Through use of the heat $Q_D$ 112 received particularly as waste heat generated through operation of the heat generating device(s), the amount of heat necessary from the primary generator 116 may be substantially reduced.

The additional desorbed refrigerant then flows to the secondary condenser 120, as indicated by the arrow 111, which condenses the refrigerant and dissipates heat $Q_{SC}$ 124. The condensed refrigerant from the primary condenser 120 contained in the secondary condenser 122 mixes with the refrigerant condensed from the secondary condenser 122. The mixed condensed refrigerant then flows through valve 128 back to the evaporator 102, as indicated by the arrow 123. Through operation of the above-identified process, the refrigerant is returned to a lower temperature and lower pressure state to thereby cool the heat generating device(s) by receiving heat generated by those device(s). The above-identified process may then be repeated on a substantially continuous basis to provide cooling fluid to, for instance, the heat generating device(s).

The absorbent separated from the absorbed refrigerant in the secondary generator 110 flows back to the absorber 106 through a valve 130 as indicated by the arrow 131. In this regard, the absorbent may be re-used in absorbing the vaporized refrigerant received from the evaporator 104.

Figure 2:
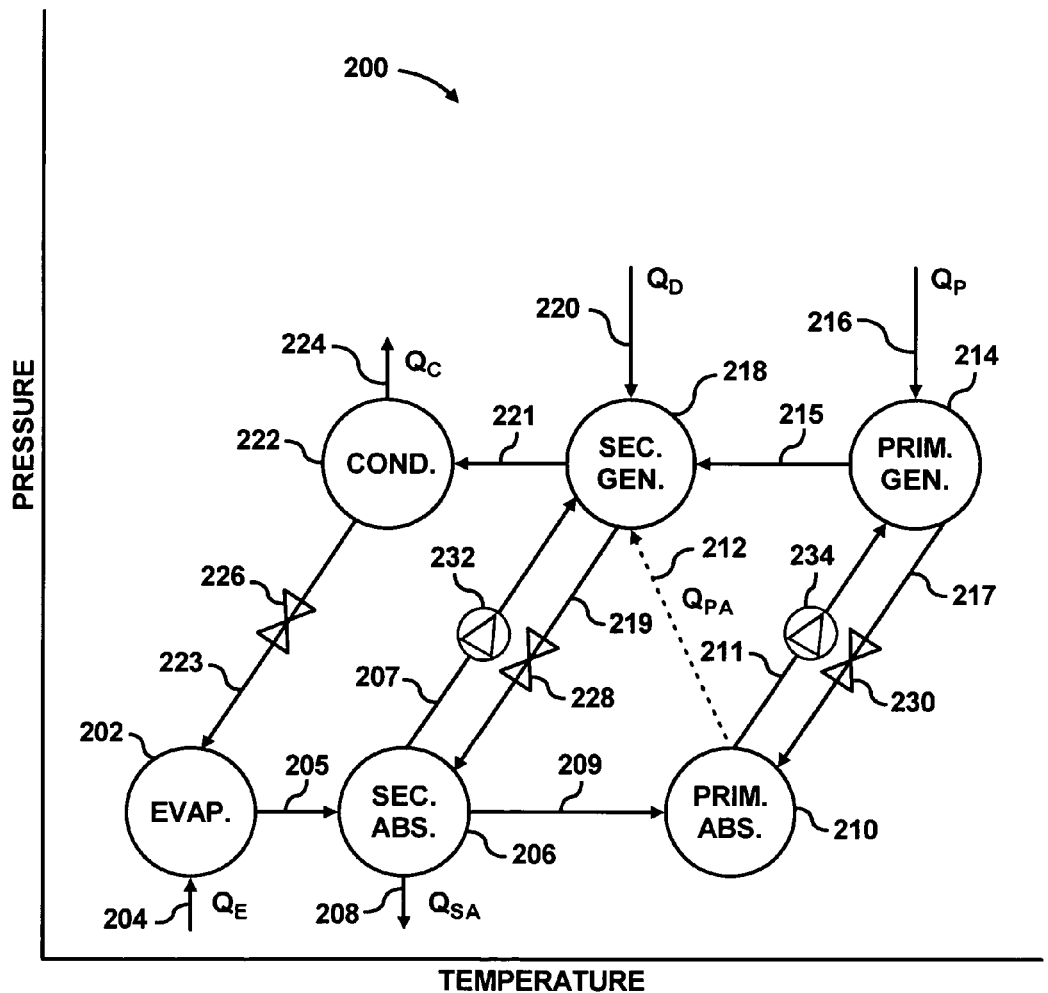
FIG. 2 shows a simplified model of an absorption system in accordance with another embodiment of the invention.

FIG. 2 shows a simplified model of a multi-effect absorption system 200 according to another embodiment of the invention. The multi-effect absorption system 200 illustrated in FIG. 2 is a double-effect double-absorber absorption system and includes an evaporator 202, a secondary absorber 206, a primary absorber 210, a secondary generator 218, a primary generator 214, and a condenser 222. In general, absorption systems use a refrigerant and an absorbent as described hereinabove. The refrigerant vaporizes in the evaporator 204 thereby absorbing heat $Q_E$ 204 from, for instance, cooling fluid heated by one or more heat generating devices. The vaporized refrigerant flows to the secondary absorber 206, as indicated by the arrow 205, and a portion of the vaporized refrigerant is absorbed into a secondary absorbent contained in the secondary absorber 206, thereby dissipating heat $Q_{SA}$ 208.

The absorbent and the absorbed refrigerant flow to the secondary generator 220 through operation of a pump 232, as indicated by the arrow 207. The remaining refrigerant flows to the primary absorber 210, as indicated by the arrow 209, and the remaining refrigerant is absorbed into a primary absorbent contained in the primary absorber 210, thereby dissipating heat $Q_{PA}$ 212. The heat $Q_{PA}$ 212 is supplied to the secondary generator 220.

The primary absorbent with the remaining refrigerant flow to the primary generator 214 through operation of a pump 234, as indicated by the arrow 211. Heat $Q_P$ 216 is supplied into the primary generator 214 from a primary heat source (not shown) and the heat $Q_P$ 216 desorbs most of the refrigerant from the primary absorbent in the primary generator 214. The desorbed refrigerant flows to the secondary generator 218, as indicated by the arrow 215. The primary absorbent flows through valve 230 to the primary absorber 210, as indicated by the arrow 217, for re-use in the primary absorber 210.

As indicated hereinabove, heat $Q_{PA}$ 212 dissipated from the desorbed refrigerant is supplied from the primary absorber 210 to the secondary generator 218. In addition, heat collected from the heat generating device(s) is also supplied to the secondary generator 218. The heat $Q_{PA}$ 212 and heat $Q_D$ 220 desorbs refrigerant from the secondary absorbent at the secondary generator 218. Through use of the heat $Q_D$ 220 received particularly as waste heat generated through operation of the heat generating device(s), the amount of heat necessary from the primary generator 214 may be substantially reduced.

The secondary absorbent then flows through valve 228 to the secondary absorber 206, as indicated by the arrow 219, for re-use in the secondary absorber 206. The desorbed refrigerant from the primary generator 214 contained in the secondary generator 218 mixes with the refrigerant desorbed at the secondary generator 218. The combined refrigerant then flows to the condenser 222, as indicated by the arrow 221. The condenser 222 generally operates to condense the combined refrigerant and thereby dissipate heat $Q_C$ 224. The condensed refrigerant then flows through valve 226 back to the evaporator 204, as indicated by the arrow 223. Through operation of the above-identified process, the refrigerant is returned to a lower temperature and lower pressure state to thereby cool the heat generating device(s) by receiving heat generated by those device(s). The above-identified process may then be repeated on a substantially continuous basis to provide cooling fluid to, for instance, the heat generating device(s).

Figure 3:
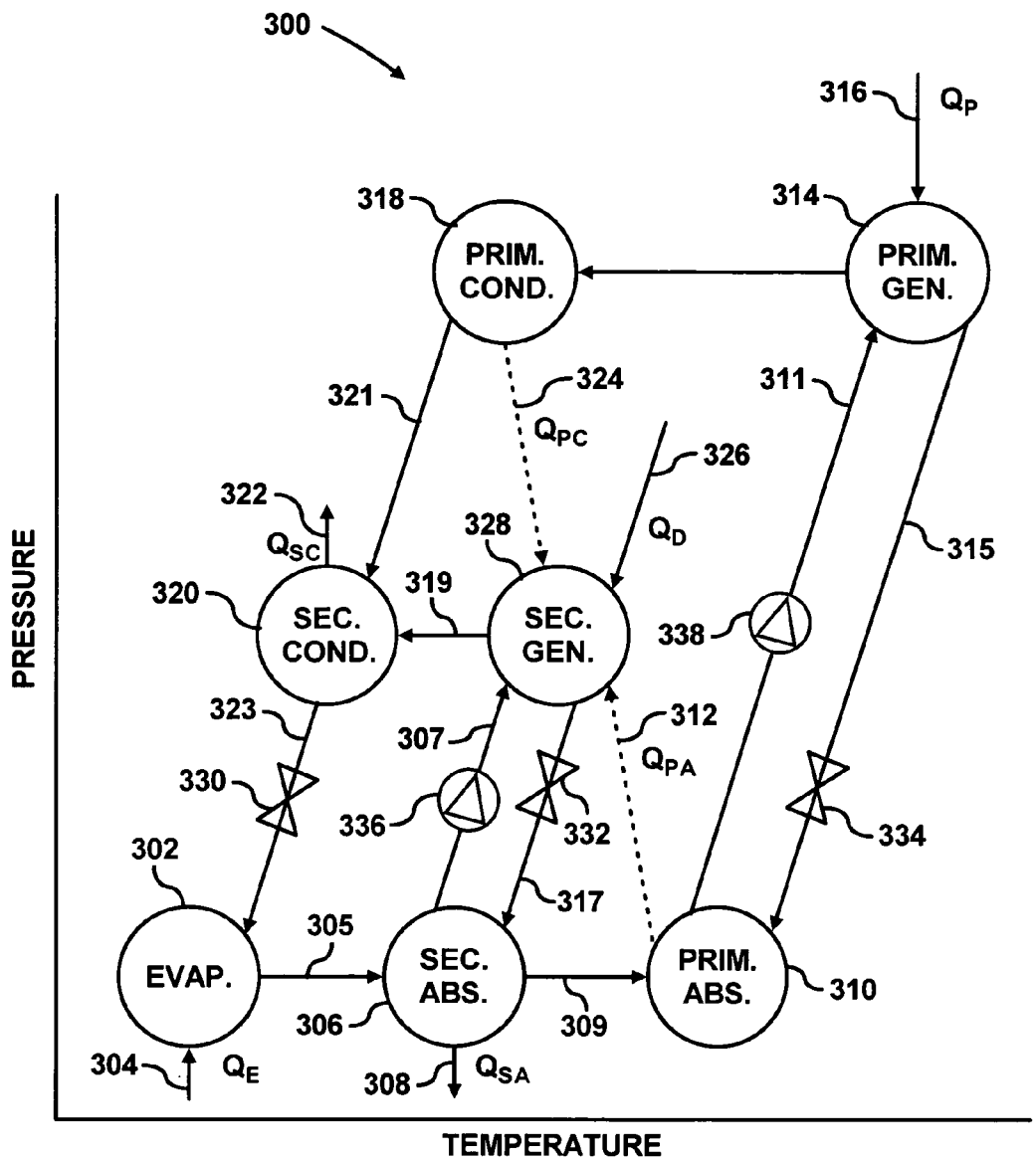
FIG. 3 shows a simplified model of an absorption system in accordance with another embodiment of the invention.

FIG. 3 shows a simplified model of a multi-effect absorption system 300 according to another embodiment of the invention. The multi-effect absorption system 300 illustrated in FIG. 3 is a triple-effect absorption system and includes an evaporator 302, a secondary absorber 306, a primary absorber 310, a secondary generator 318, a primary generator 314, a primary condenser 318 and a secondary condenser 320. In general, triple-effect absorption systems use a refrigerant and an absorbent as described hereinabove The refrigerant vaporizes in the evaporator 304 absorbing heat $Q_E$ 304 from, for instance, one or more heat generating devices. The vaporized refrigerant flows to the secondary absorber 306, as indicated by the arrow 305, and a portion of the vaporized refrigerant is absorbed into a secondary absorbent contained in the secondary absorber 306, thereby dissipating heat $Q_{SA}$ 308.

The secondary absorbent and the absorbed refrigerant flow to the secondary generator 328 through operation of a pump 336, as indicated by the arrow 307. The remaining refrigerant flows to the primary absorber 310, as indicated by the arrow 309 and the remaining refrigerant is absorbed into a primary absorbent contained in the primary absorber 310, thereby dissipating heat $Q_{PA}$ 312. The heat $Q_{PA}$ 312 is supplied to the secondary generator 328.

The primary absorbent with the remaining refrigerant flow to the primary generator 314 through operation of a pump 338, as indicated by the arrow 311. Heat $Q_P$ 316 is supplied into the primary generator 314 from a primary heat source (not shown) and the heat $Q_P$ 316 desorbs most of the refrigerant from the primary absorbent in the primary generator 314. The desorbed refrigerant flows to the primary condenser 318, as indicated by the arrow 313. The desorbed refrigerant is condensed in the primary condenser 318 and heat $Q_{PC}$ 324 is dissipated during the condensation process. The heat $Q_{PC}$ 324 is supplied to the secondary generator 328.

The primary absorbent in the primary generator 314 flows through valve 334 to the primary absorber 310, as indicated by the arrow 315, for re-use in the primary absorber 310. As indicated hereinabove, heat $Q_{PA}$ 312 from the primary absorber 310 and heat $Q_{PC}$ 324 from the primary condenser 318 are supplied to the secondary generator 328. In addition, heat $Q_D$ 326 collected from the heat generating device(s) is also supplied to the secondary generator 328. The heat $Q_{PA}$ 312, heat $Q_{PC}$ 324, and heat $Q_D$ 326 desorbs refrigerant from the secondary absorbent at the secondary generator 328. Through use of the heat $Q_D$ 326 received particularly as waste heat generated through operation of the heat generating device(s), the amount of heat necessary from the primary generator 314 may be substantially reduced.

The secondary absorbent then flows through valve 332 to the secondary absorber 306, as indicated by the arrow 317, for re-use in the secondary absorber 306. The desorbed refrigerant from the secondary generator 328 flows to the secondary condenser 320, as indicated by the arrow 319. In addition, the refrigerant from the primary condenser 318 flows to the secondary condenser 320 as indicated by the arrow 321. The secondary condenser 320 generally operates to condense the refrigerant received from the primary condenser 315 and the secondary generator 328 to thereby dissipate heat $Q_{SC}$ 114 and return a substantial portion of the refrigerant back into a liquid. The condensed refrigerant then flows through valve 330 back to the evaporator 302, as indicated by the arrow 323. Through operation of the above-identified process, the refrigerant is returned to a lower temperature and lower pressure state to thereby cool the heat generating device(s) by receiving heat generated by those device(s). The above-identified process may then be repeated on a substantially continuous basis to provide cooling fluid to, for instance, the heat generating device(s)

Figure 4:
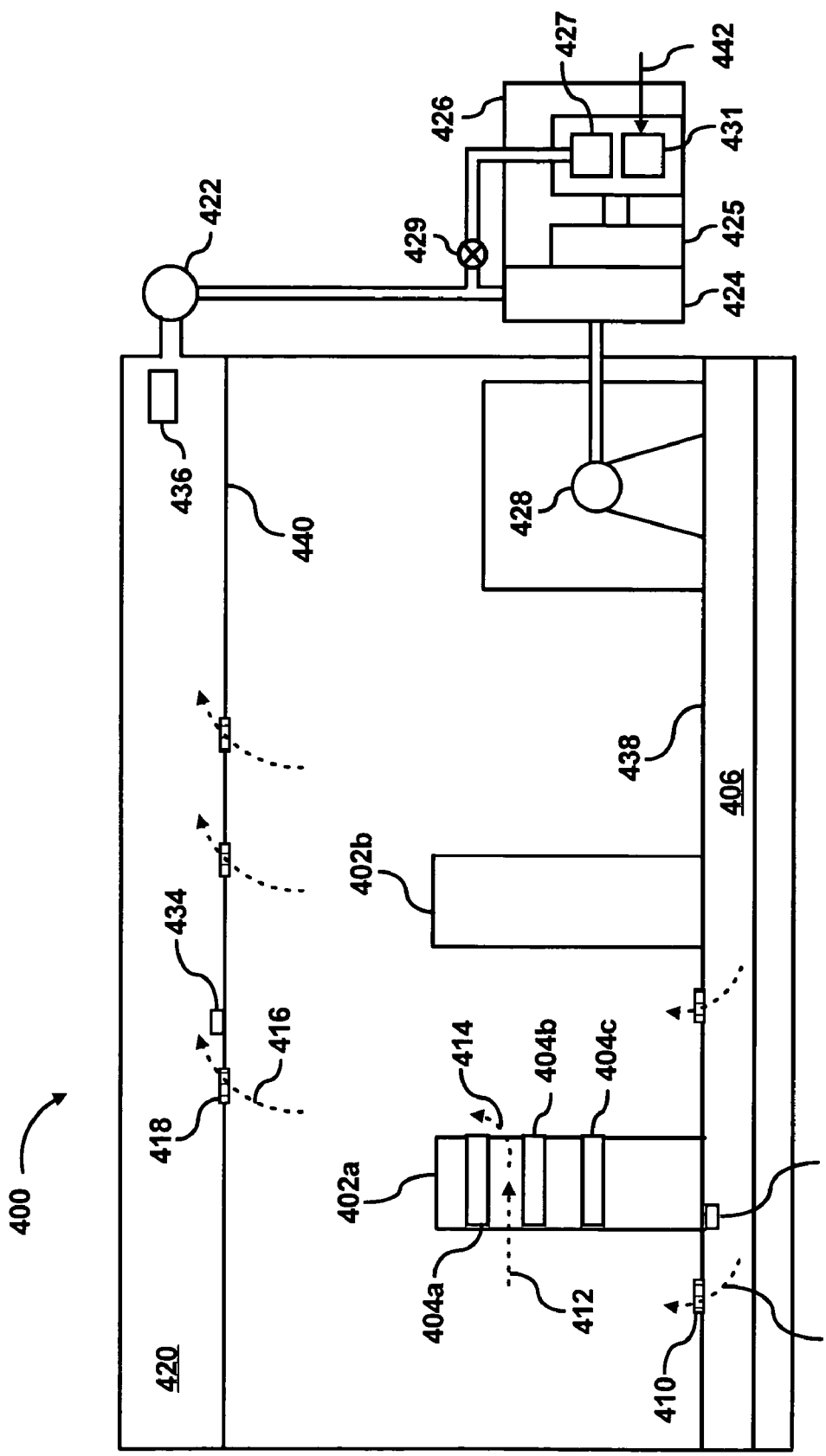
FIG. 4 shows a simplified schematic illustration of a room and absorption system according to an embodiment of the invention.

FIG. 4 shows a simplified schematic illustration of a room 400 cooled by a multi-effect absorption system 426 according to an embodiment of the invention. The room 400, which may be configured as a data center, includes a raised floor 438. A plurality of wires and communication lines (not shown) may be located in a space 406 beneath the raised floor 438. In addition, the space 406 may function as a plenum to deliver cooling fluid (e.g., air) from the absorption system 426 to racks 402a and 402b through a vent 410 or a series of vents. The room 400 may further include a lowered ceiling 440. In a manner similar to the raised floor 438, the lowered ceiling 440 may include a space 420 in which a plurality of wires and communication lines (not shown) may be located and include a vent 418 or a plurality of vents. In addition, the space 420 may function as a plenum to collect heated cooling fluid for routing to the heat exchanger 424. Although the room 400 is illustrated in FIG. 4 as containing two racks 402a and 402b and a multi-effect absorption system 426, it should be understood that the room 400 may include any number of racks, e.g., 100 racks or more, and cooling systems, e.g., four or more. The illustration of two racks is for illustrative and simplicity of description purposes only and is not intended to limit the invention in any respect.

The racks 402a and 402b generally house a plurality of heat generating devices or components 404a–404c, e.g., processors, micro-controllers, high speed video cards, memories, semi-conductor devices, and the like. The components 404a–404c may comprise elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 402a and 402b have been generally known to include upwards of forty (40) or more subsystems, they may transfer substantially large amounts of heat to the cooling fluid. Therefore, a large amount of cooling fluid is required to maintain the subsystems and the components generally within a predetermined operating temperature range.

The room 400 includes a multi-effect absorption system 426, e.g., the multi-effect absorption systems 100, 200, 300 (FIGS. 1–3, respectively), and a cooling fan 428 for supplying cooling fluid (e.g., air) into the space 406 (e.g., floor plenum) and a heat collecting fan 422 for drawing hot air from the space 420 (e.g., ceiling plenum). The heat collecting fan 422 then directs the hot air to a heat exchanger 424 for exchanging heat with the multi-effect absorption system 426. Specifically, heat exchange takes place between the heat exchanger 424 and the evaporator 425 of the multi-effect absorption system 426. The multi-effect absorption system 426 may be configured in several ways and may include of the components as described above. However, to achieve increased efficiency, some or all of the collected heat is supplied to the secondary generator 427 of the multi-effect absorption system 426. The amount of heated cooling fluid supplied to the secondary generator 427 may be metered by a valve 429.

Although reference is made throughout the present disclosure of the use of a fan 422 to draw heated cooling fluid from the space 420, it should be understood that any other reasonably suitable manner of air removal may be implemented without departing from the scope of the invention. By way of example, an additional fan (not shown) may be provided to draw air from the space 420. Alternatively, the intakes of the space 420 may be provided with fans (not shown) such that each intake may draw a substantially independent amount of air from the room 400. For instance, the vents 418 may comprise the configurations and operate in manners as described in co-pending and commonly assigned U.S. patent application Ser. No. 10/303,761, filed on Nov. 26, 2002, the disclosure of which is hereby incorporated by reference in its entirety. As discussed in that application, the vents 418 may be substantially independently controlled to vary the locations and magnitudes of heated cooling fluid drawn from the room 400. In one regard, through implementation of the principles described in that application, temperature of the cooling fluid received from the room may be maintained at substantially the highest levels. Through delivery of the relatively hot cooling fluid to the absorption system 426, the efficiency of heat transfer between the heat cooling fluid and the refrigerant contained in the absorption system 426 may substantially be optimized.

The room 400 may include several temperature sensors. According to an embodiment of the invention, a temperature sensor 432 may be placed near the rack 402a to sense the temperature of the cooling fluid delivered to the rack 402a. A temperature sensor (not shown) may also be placed in the rack 402a or in the heat generating devices 404a–404c to detect their temperatures. Additional temperature sensors 434 and 436 may be located in the plenum 420 or near the heat collection fan 422 for measuring the temperature of the heated cooling fluid. The sensed temperature readings from the sensor 432 or other sensors in the room 400, racks 402a, 402b, or heat generating devices 404a–404c, may be used to determine how much heat, from the primary heat source 442, to apply to a primary generator 431 of the multi-effect absorption system 426. Applying additional heat from the primary heat source 442 generally increases the cooling effect of the multi-effect absorption system 426. Reducing heat from the primary heat source 442 generally decreases the cooling effect of the multi-effect absorption system 426.

Additionally, the sensed temperature readings from temperature sensors 434 and 436 may be used to determine the amount of heated cooling fluid added to the secondary generator 427 of the multi-effect absorption system 426. The added heat generally reduces the heat required from the primary heat source 442, thus increasing the efficiency of the multi-effect absorption system 426.

Operationally, the primary heat source 442 provides the main energy source through direct heat supply to the multi-effect absorption system 426. The cooling fan 428 draws the cooled cooling fluid the heat exchanger 424 and forces the cooled cooling fluid into the plenum 406. The cooling fluid flows in the direction of arrow 408 through the vent 410 into the room 400. The cooling fluid circulates through the rack 402a in the direction of arrows 412 and 414, absorbing heat from the heat generating devices 404a–404c. The heat collection fan 422 pulls the heated cooling fluid as shown by the arrow 416 through the vent 418 and into the plenum 420. The heat collection fan 422 then forces the heated cooling fluid into the heat exchanger 424, where heat is removed from the heated cooling fluid through heat exchange with the evaporator 424, and this process may be repeated to substantially continuously supply cooling fluid to cool the heat generating devices 404a–404c.

As the cooling requirements vary according to the heat loads in the racks 402a and 402b, and the subsequent variations in the volume flow rate of the cooling fluid, the multi-effect absorption system 426 may also vary the amount of cooling fluid supplied to the racks. As an example, if the heat load in the racks 402a and 402b generally increases, the multi-effect absorption system 426 may operate to increase the supply of cooling fluid and/or the return of heated cooling fluid. This is accomplished by increasing the heat output of the primary heat source 442 or increasing the heated cooling fluid provided to the secondary generator 427. Accordingly, an increase in the heat load of the racks 402a and 402b provides an increase in heat exchanged at the heat exchanger 424. This situation leads to an increase in efficiency of the multi-effect absorption system 426. Alternatively, if the heat load in the racks 402a and 402b generally decreases, the multi-effect absorption system 426 may operate to decrease the supply of cooling fluid and/or the return of heated cooling fluid.

Figure 5:
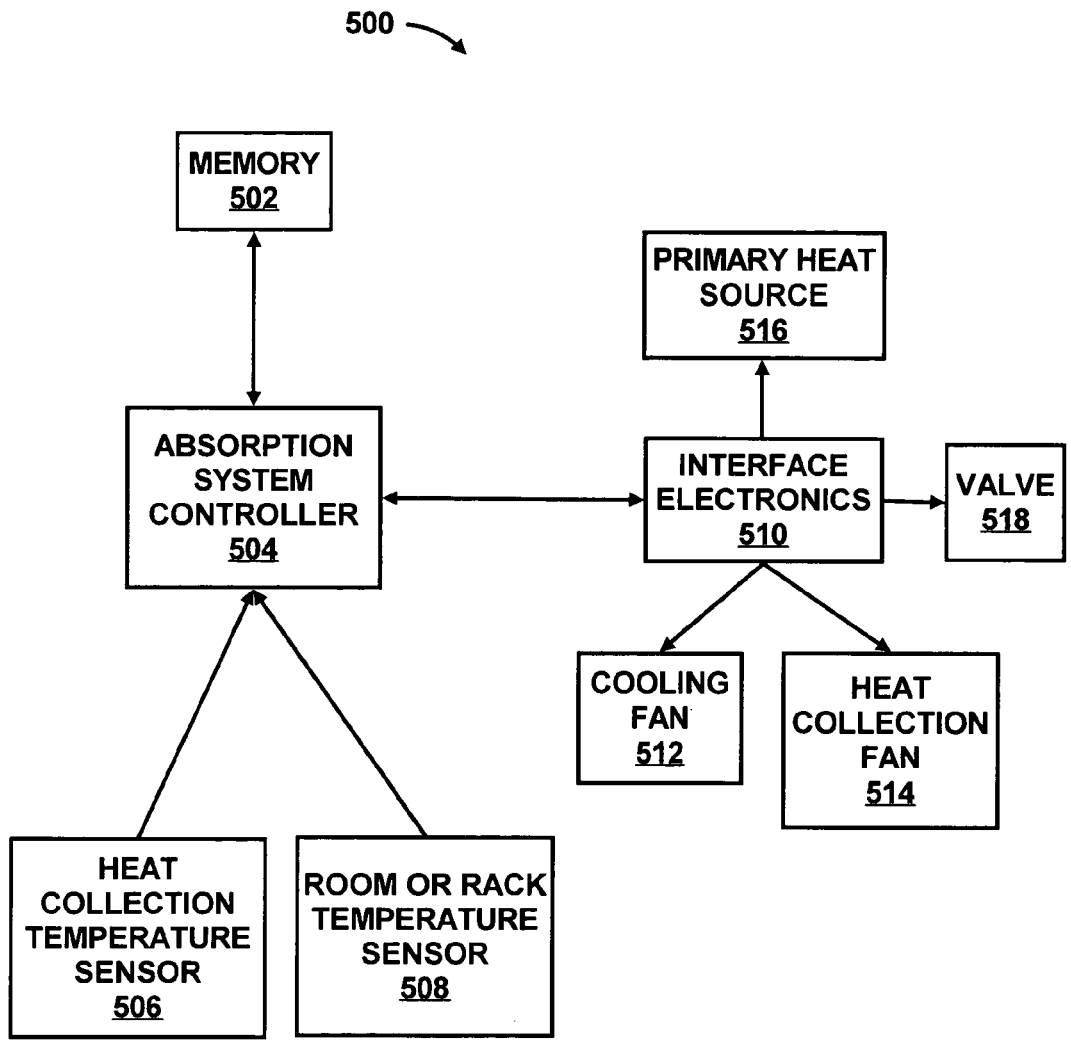
FIG. 5 illustrates a block diagram of a control scheme according to an embodiment of the invention.

Referring to FIG. 5, there is illustrated a block diagram of a control scheme 500 for the multi-effect absorption system 426 according to an embodiment of the invention. The following description of the control scheme 500 is one manner in which the absorption system, e.g., absorption system 426, may be operated. In this respect, it is to be understood that the following description of the control scheme 500 is but one manner of a variety of different manners in which such an absorption system may be operated. According to this embodiment of the invention, the control scheme 500 includes an absorption system controller 504 having a memory 502. The control scheme 500 also includes a heat collection temperature sensor 506, a room or rack temperature sensor 508, interface electronics 510, a cooling fan 512, a heat collection fan 514, a primary heat source 516 and a valve 518, e.g., valve 429 (FIG. 4), for controlling waste heat supply to the secondary generator, e.g., secondary generator 427 (FIG. 4).

The absorption system controller 504 is generally configured to control the operation of the cooling fan 512, the heat collection fan 514, the primary heat source 516, and the valve 518 via interface electronics 510. It should be noted that the output of the absorption system may be determined by the input of heat from the primary heat source 516. Therefore, the absorption system controller 504, by controlling the primary heat source 516, controls the output of the absorption system 426. The absorption system controller 504 may comprise a microprocessor, a microcontroller, an application specific integrated circuit (ASIC) or the like.

The absorption system controller 504 may be interfaced with a memory 502 configured to provide storage of computer software that provides the functionality of the absorption system controller 504. The memory 502 may also be configured to provide storage for containing data/information pertaining to the amount of heat to add to the absorption system 426 from the primary heat source 516 dependent upon the temperature reading from the room or rack temperature sensor 508 and the temperature reading from the heat collection temperature sensor 506. In addition, the determination of the amount of heat to add to the absorption system 426 and more particularly to the primary generator, may be based upon the amount of waste heat collected from the heat generating devices and supplied to the secondary generator. The memory 502 may also store this information. The memory 502 may be implemented as a combination of volatile and non-volatile memory, such as dynamic random access memory (DRAM), EEPROM, flash memory, and the like.

Interface electronics 510 may be provided to act as an interface between the absorption system controller 504 and the primary heat source 516, the cooling fan 512, the heat collection fan 514, and the valve 518. By way of example, the interface electronics 510 may also be configured to vary the supply of voltage to vary the respective speeds of the fans 512 and 514, control the output of the primary heat source 516 through, for instance, control of a valve configured to meter the heat flow from the primary heat source 516, or control the waste heat delivery to the secondary generator through control of the flow of cooling fluid through the valve 518.

The absorption system controller 504 receives information pertaining to the temperature of the room or rack from the room or rack temperature sensor 508. If there is an increase in heat load or an increase of sensed temperature from the room or rack temperature sensor 508, the absorption system controller 504, through the interface electronics 510 may increase the heat delivered to the primary generator from the primary heat source 516, thus increasing the cooling output of the absorption system. According to embodiments of the invention, however, the absorption system controller 504 may increase the delivery of waste heat collected from the heat generating devices to the secondary generator, thus reducing or eliminating the increase in heat delivered to the primary generator. In this case, the heat supplied to the secondary generator may be increased because, in general, an increased room or rack temperature corresponds to an increase in temperature of the heated cooling fluid. Therefore, the absorption system controller 504 also monitors the heated cooling fluid temperature from the heat collection temperature sensor 506. An increase in temperature from the heat collection sensor 506 corresponds to an increase in heat available for delivery to the secondary generator. Therefore, less heat is required from the primary heat source 516 to maintain the required cooling output. The adjustment determination may be determined through a mathematical formula or a look up table, which may be stored in the memory 502.

Figure 6:
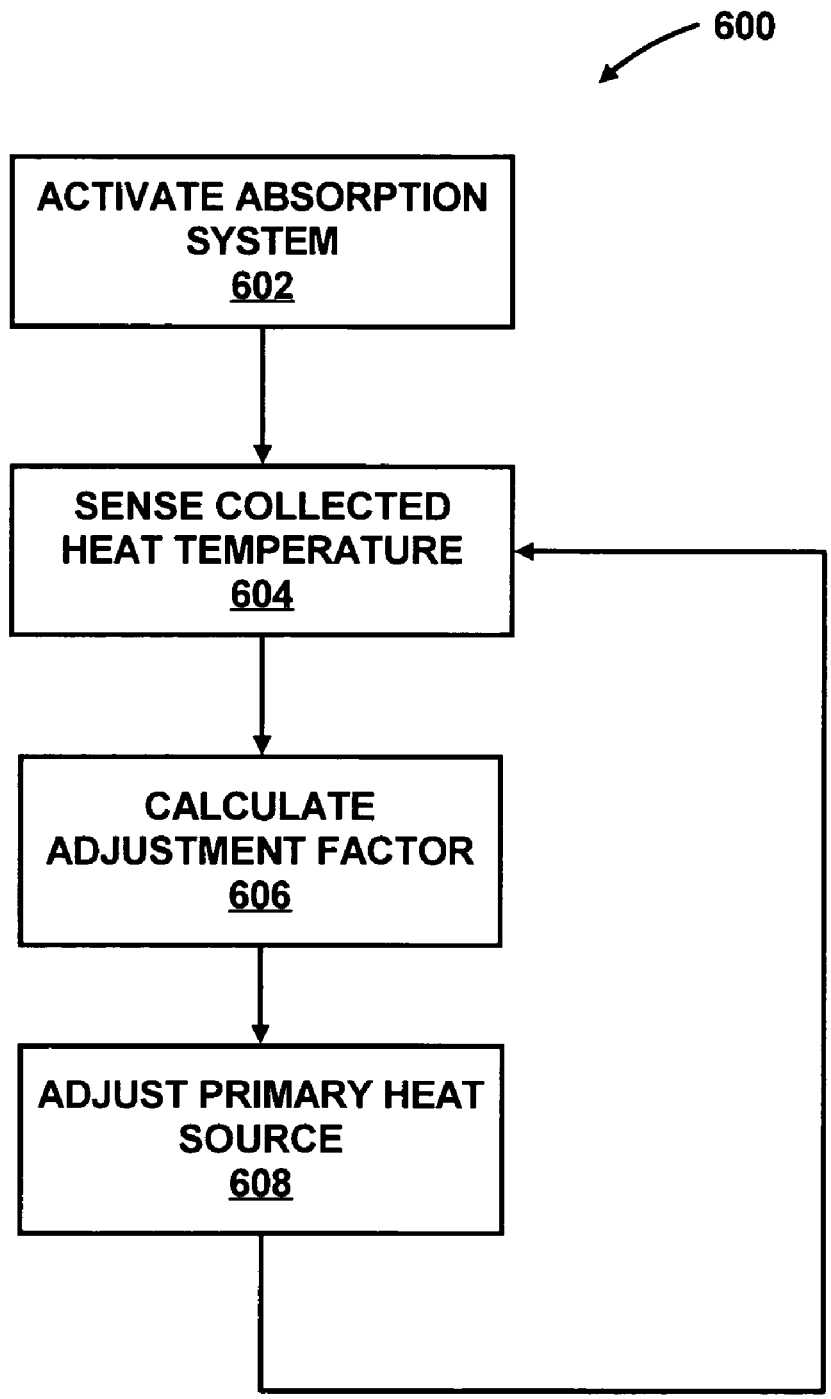
FIG. 6 shows a flow diagram of an operational mode depicting a manner in which a multi-effect absorption system may be implemented according to an embodiment of the invention.

FIG. 6 shows a flow diagram of an operational mode 600 depicting a manner in which a multi-effect absorption system may be implemented according to an embodiment of the invention. The following description of the operational mode 600 is made with reference to the block diagram 500 illustrated in FIG. 5, and thus makes reference to the elements cited therein. The following description of the operational mode 600 is one manner in which the absorption system, e.g., absorption system 426, may be implemented. In this respect, it is to be understood that the following description of the operational mode 600 is but one manner of a variety of different manners in which such an absorption system may be operated.

In the operational mode 600, the absorption system 426 is activated by activating the primary heat source 516, the cooling fan 512 and the heat collection fan 514 at step 602. The temperature of the heated cooling fluid is measured with the heat collection temperature sensor 506 at step 604. Additionally, a mass flow sensor (not show) may be used to better estimate the exergy content of the heated cooling fluid. At step 606, an adjustment factor is calculated. The adjustment factor is a value, either calculated or determined from a look up table, which indicates a decrease or an increase in heat required from the primary heat source 516 due to the heat collected from the heat collection fan 514, which may also be adjusted if necessary. In step 608, the primary heat source is adjusted according to the adjustment factor. In one regard, the adjustment factor may be based upon the level of waste heat supplied to the secondary generator. That is, for instance, the adjustment factor may be determined to decrease heat required from the primary heat source 516 if the level of waste heat supplied to the secondary generator is relatively high.

Figure 7:
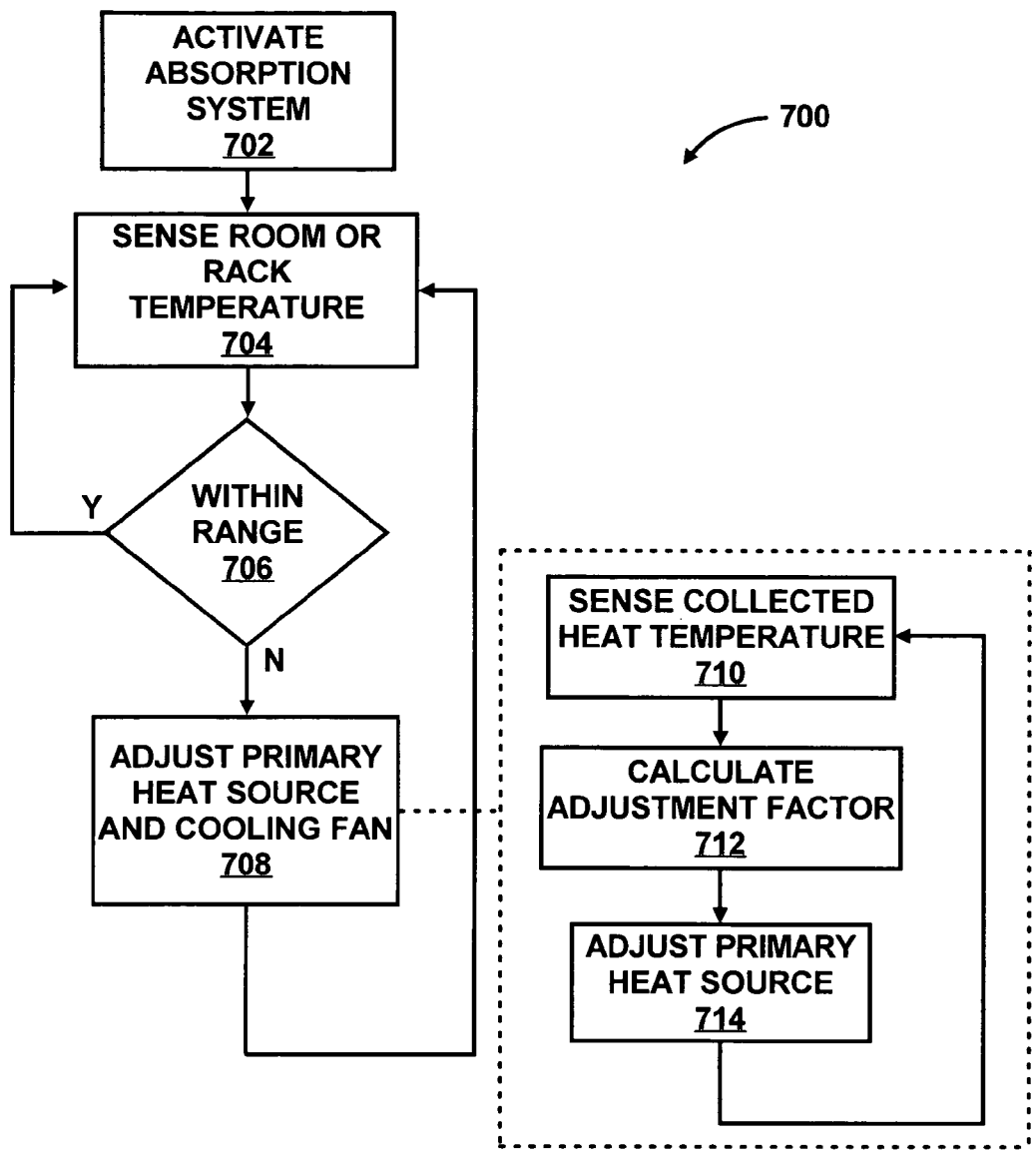
FIG. 7 shows a flow diagram of an operational mode 700 depicting a manner in which a multi-effect absorption system may be implemented according to another embodiment of the invention.

FIG. 7 shows a flow diagram of an operational mode 700 depicting a manner in which a multi-effect absorption system may be implemented according to another embodiment of the invention. The following description of the operational mode 700 is made with reference to the block diagram 500 illustrated in FIG. 5, and thus makes reference to the elements cited therein. The following description of the operational mode 700 is one manner in which the absorption system, e.g., absorption system 426, may be implemented. In this respect, it is to be understood that the following description of the operational mode 700 is but one manner of a variety of different manners in which such an absorption system may be operated.

In the operational mode 700, the absorption system is activated by activating the primary heat source 516, the cooling fan 512 and the heat collection fan 514 at step 702. The temperature of the room or rack is measured by the room or rack temperature sensor 508 at step 704. A determination is then made in step 706 to check to see if the temperature is within an operating range. If the temperature is within the operating range, step 704 is repeated. If the temperature remains in the operational range, the supply of heat from the primary heat source 516 is not adjusted. If the temperature is not within the operating range, step 708 is performed. At step 708, the primary heat source 516 is adjusted as well as a corresponding adjustment to the cooling fan 512 if necessary. Step 704 may then be repeated.

In adjusting the supply of heat from the primary heat source 516 at step 708, additional steps may be performed. In the first additional step 710, the temperature of the heated cooling fluid is measured with the heat collection temperature sensor 506. In step 712, an adjustment factor is calculated. The adjustment factor is a value, either calculated or determined from a look up table, which indicates a decrease or an increase in heat required from the primary heat source 516 due to the heat collected from the heat collection fan 514 which may also be adjusted if necessary. As described in greater detail hereinabove, the adjustment factor may also be based upon the level of waste heat delivered to the secondary generator. At step 714, the supply of heat from the primary heat source 516 is adjusted according to the adjustment factor.

Alternatively, steps 710, 712 and 714 may run continually during any point in the operation of the absorption system. Continual running of these steps provides for a dynamically adjustable system which may increase overall efficiency of the absorption system.

The steps illustrated in the operational modes 600 and 700 may be contained as a utility, program, subprogram, in any desired computer accessible medium. In addition, the operational modes 600 and 700 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

Figure 8:
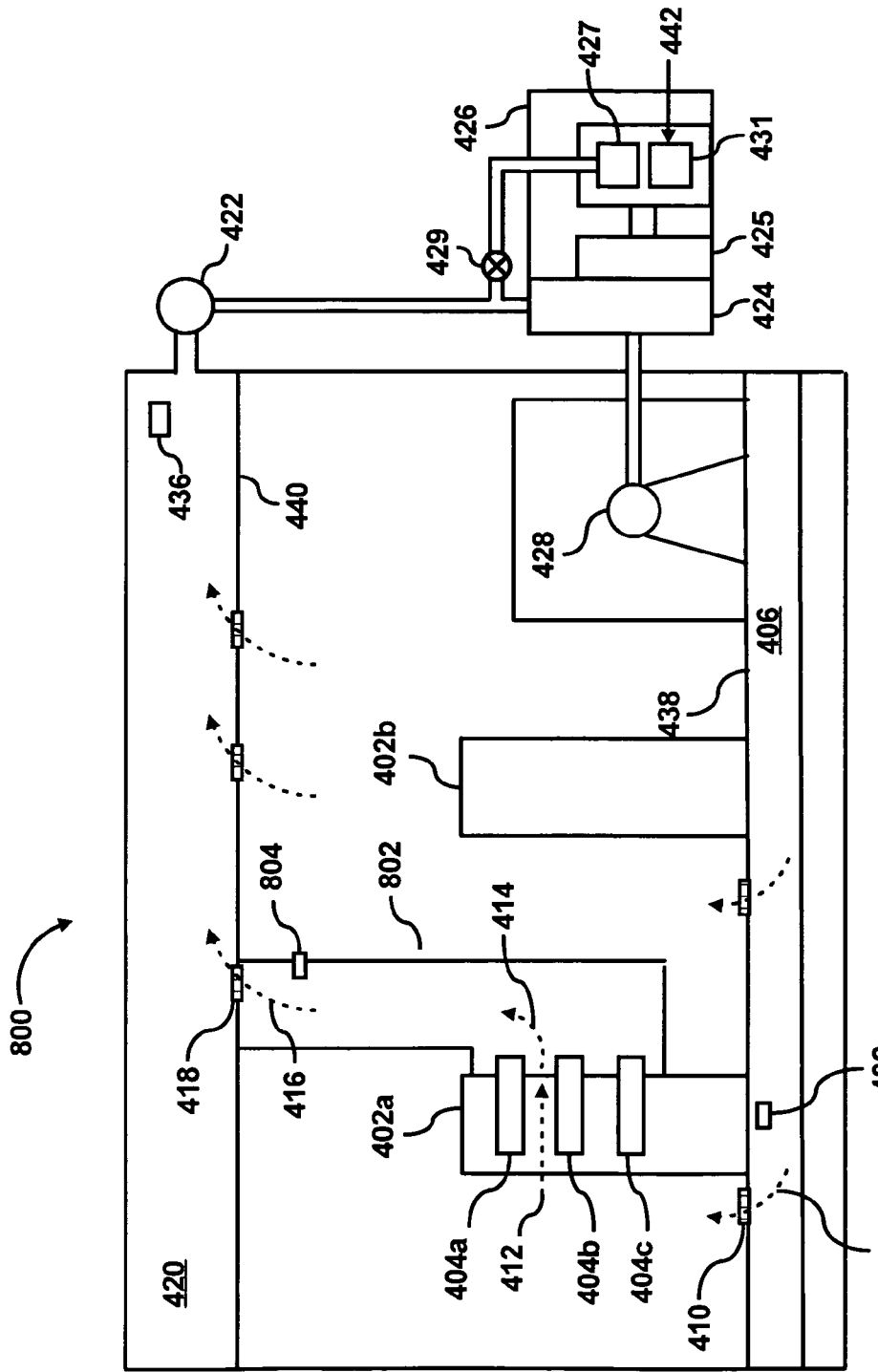
FIG. 8 shows a simplified schematic illustration of a room and absorption system according to another embodiment of the invention.

FIG. 8 shows a simplified schematic illustration of a room 800 cooled by a multi-effect absorption system 426 according to an embodiment of the invention. The configuration and operation of the room 800 is similar to the configuration and operation of the room 400 described hereinabove with respect to FIG. 4. Accordingly, only those elements that differ in the room 800 from the room 400 will be described hereinbelow. The description provided hereinabove with respect to the room 400 is therefore relied upon to provide an adequate description of the common elements contained in FIG. 8.

As illustrated in FIG. 8, a duct 802 is provided to collect heated cooling fluid from the rack 402a. In this regard, the duct 802 is configured to collect cooling fluid heated by the heat generating devices 404a–404c. The duct 802 also operates to heat cooling fluid directly from the rack 802a and into the plenum 420 through vent 418. Although a vent 418 is shown in FIG. 8, the ceiling 440 may include an opening (not shown) without departing from the scope of the invention. The directing of heated cooling fluid through the duct 802 generally maintains the temperature of the heated cooling fluid collected from the rack 402a and delivered to the absorption system 426 at relatively high levels because it substantially prevents cooler cooling fluid from recirculating into the heated cooling fluid. Resultantly, due to the substantially high temperature of the heated cooling fluid delivered to the secondary generator, the multi-effect absorption system 426 may operate in a relatively efficient manner.

A temperature sensor 804 may be positioned in the duct 802 to detect the temperature of the heated cooling fluid exhausted through the duct 802. The sensed temperature readings from the sensor 804 may be implemented in determining how much heat, from the primary heat source 442, to apply to a primary generator 431 of the multi-effect absorption system 426. As described hereinabove, the amount of heat supplied to the primary generator 431 may be reduced based upon the amount of heat supplied to the secondary generator 427.

Figure 9:
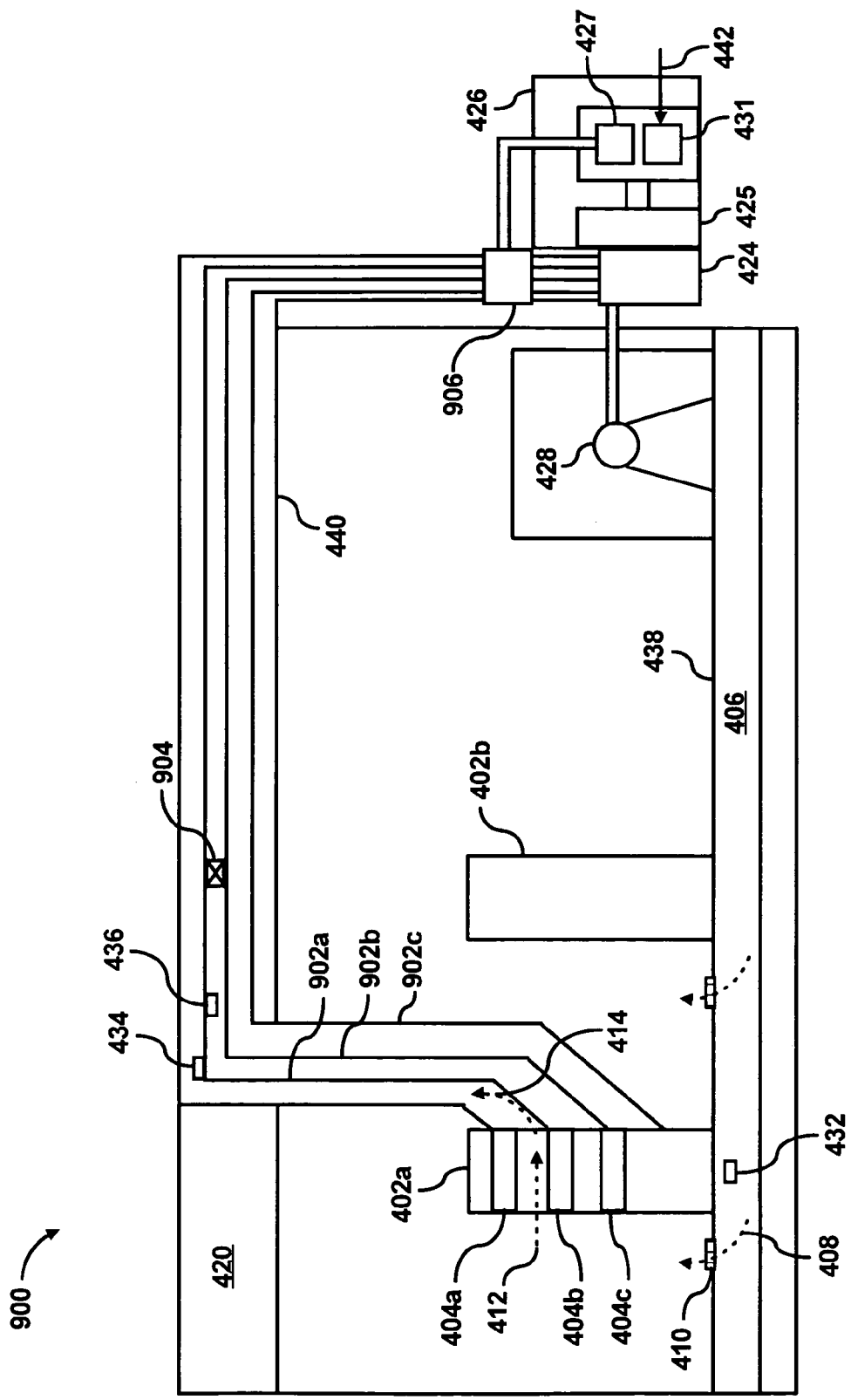
FIG. 9 shows a simplified schematic illustration of a room and absorption system according to another embodiment of the invention.

FIG. 9 shows a simplified schematic illustration of a room 900 cooled by a multi-effect absorption system 426 according to another embodiment of the invention. The configuration and operation of the room 900 is similar to the configuration and operation of the room 400 described hereinabove with respect to FIG. 4. Accordingly, only those elements that differ in the room 900 from the room 400 will be described hereinbelow. The description provided hereinabove with respect to the room 400 is therefore relied upon to provide an adequate description of the common elements contained in FIG. 9.

As illustrated in FIG. 9, a plurality of ducts 902a–902c are positioned to receive cooling fluid heated by respective heat generating devices 404a–404c. Although three ducts 902a–902c are illustrated in FIG. 9, any number of ducts connecting to any number of racks or components may be implemented without departing from the scope of the invention. In addition, although the number of ducts 902a–902c is depicted as corresponding to the number of heat generating devices 404a–404c contained in the rack 402a, any reasonably suitable configuration of the ducts 902a–902c and heat generating devices 404a–404c may be implemented in accordance with principles of the invention. In this regard, for instance, one or more of the ducts 902a–902c may be configured to receive heated cooling fluid from any number of heat generating devices 404a–404c. Consequentially, the number of possible arrangements is virtually unlimited.

In another embodiment of the invention, a fan 904 may be provided in one or more of the ducts 902a–902c. This arrangement allows for adjusting the amount of heated cooling fluid drawn from the ducts. In addition, the directing of heated cooling fluid through the ducts 902a–902c generally maintains the temperature of the heated cooling fluid collected from the heat generating devices 404a–404c and delivered to the absorption system 426 at relatively high levels because it substantially prevents cooler cooling fluid from recirculating into the heated cooling fluid.

In any event, the heated cooling fluid collected from the heat generating devices 404a–404c may substantially individually be collected and supplied to the cooling system, i.e., the heat exchanger 424 and the absorption system 426. In this regard, the ducts 902a–902c may each flow through, for instance, a three-way valve 906 configured to regulate flow of the heated cooling fluid to either the heat exchanger 424 or the secondary generator 427. Resultantly, due to the substantially high temperature of the heated cooling fluid delivered to the secondary generator 427, the multi-effect absorption system 426 may operate in a relatively efficient manner.

As described hereinabove, the amount of heat supplied to the primary generator 431 may be reduced based upon the amount of heat supplied to the secondary generator 427. Thus, for instance, if a greater volume or higher temperature heat is supplied to the secondary generator 427, the amount of heat supplied from the primary heat source 442 to the primary generator 431 may be relatively reduced, thereby decreasing the costs associated with operating the absorption system 426 in particular and in cooling the room 900 in general.

An improvement to the coefficient of performance is obtained from the arrangements described above. The coefficient of performance of an absorption system is given by the following equation:

$$COP = \frac{EvaporatorHeatLoad}{GeneratorHeatLoad} = \frac{Q_E}{Q_P}$$

Typically, $Q_D$ is zero in double effect cycles because the heat requirement in the secondary generator is fulfilled by $Q_{PC}$ obtained from the primary condenser. This leads to higher coefficients of performance compared to single effect absorption refrigeration cycles.

By virtue of the arrangements described herein above, additional $Q_D$ from a waste heat source can reduce the $Q_P$ consumed by the cycle without changing the delivered cooling (i.e., $Q_E$). In one respect, because any reduction in $Q_P$ will improve the COP, as shown in the equation above, the COP may be improved with the additional $Q_D$ from the waste heat source. This change may improve the COP by as much as 100%. Therefore, according to embodiments of the invention the COP of a multi-effect absorption system may be improved.

Additionally, the second law efficiency is improved from the arrangements shown above. The second law efficiency ($\eta_{II}$) is defined as a ratio of actual work (W) over the available work ($W_{max}$). The available work is defined as a product of the heat added to the system and the Carnot efficiency. In embodiments of the invention, the available work is the total power supplied to the room or the heat generating devices and the systems for cooling the heat generating devices.

$$\eta_{II} = \frac{W}{W_{max}} = 1 - \frac{W_{lost}}{W_{max}}$$

In addition, the lost work ($W_{lost}$) is the heat rejected to the environment times the Carnot efficiency.

$$W_{lost} = Q \eta_{carnot} = Q\left(1 - \frac{T_o}{T_{exhaust}}\right)$$

where $T_o$ is the ambient temperature.

Any utilization of waste exhaust heat (Q) for cooling of the room reduces the $W_{lost}$ significantly and generally improves the second law efficiency of multi-effect absorption systems.

By virtue of certain embodiments of the invention, waste heat generated through operation of heat generating devices, e.g., computers, servers, displays, etc., may be supplied to a cooling system implementing an absorption system to cool cooling fluid delivered to cool the heat generating devices. In one regard, the waste heat is collected and supplied to the secondary generator of the absorption system to thereby reduce the amount of heat supplied to the primary generator. Through reduction in the amount of heat supplied to the primary generator, the costs associated with obtaining the heat for delivery into the primary generator may also be reduced, thereby yielding a savings in costs associated with operating the absorption system.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which intended to be defined by the following claims—and their equivalents—in which all terms are meant in their broadest reasonable sense unless otherwise indicated.

What is claimed is:

1. A method of reducing energy consumption in a multi-effect absorption system having a primary generator for a primary desorption process and a secondary generator for a secondary desorption process, comprising the steps of:
   providing heat to the primary generator from a primary heat source for the primary desorption process;
   cooling a heat generating device with cooling fluid supplied by the multi-effect absorption system;
   collecting heat generated by the heat generating device; and
   transferring the collected heat to the secondary generator for use in the secondary desorption process thereby reducing the amount of heat required from the primary heat source and reducing the energy consumption of the absorption system.

2. The method according to claim 1, wherein the multi-effect absorption system is a double-effect double-condenser system having a primary condenser; wherein the primary condenser dissipates heat, the method further comprising:
   collecting heat dissipated by the primary condenser; and
   transferring the collected heat from the primary condenser to the secondary generator for use in the secondary desorption process.

3. The method according to claim 1, wherein the multi-effect absorption system is a double-effect double-absorber system having a primary absorber, wherein the primary absorber dissipates heat, the method further comprising:
   collecting heat dissipated by the primary absorber; and
   transferring the collected heat from the primary absorber to the secondary generator for use in the secondary desorption process.

4. The method according to claim 1, wherein the multi-effect absorption system is a triple-effect absorption system having a primary absorber and a primary condenser, wherein the primary absorber and the primary condenser dissipate heat, the method further comprising:
   collecting heat dissipated by the primary absorber and the primary condenser; and
   transferring the heat collected from the primary absorber and the primary condenser to the secondary generator for use in the secondary desorption process.

5. The method according to claim 1, wherein the multi-effect absorption system receives cooling fluid heated by the heat generating device, said multi-effect absorption system comprising an evaporator, said method further comprising:

cooling the heated cooling fluid through heat exchange between a heat exchanger and die evaporator in the multi-effect absorption system; and supplying the cooled cooling fluid to the heat generating device, wherein the heat generating device is housed in a rack.

6. The method according to claim 5, wherein step of collecting heat generated by the heat generating device comprises collecting heat from the rack housing a plurality of heat generating devices, said rack being housed in room.

7. The method according to claim 6, wherein the step of collecting heat from the rack housing the plurality of heat generating devices comprises collecting heat through at least one vent in a plenum.

8. The method according to claim 6, wherein the step of collecting heat from the rack housing the plurality of heat generating devices comprises collecting heat through a ducting system.

9. The method according to claim 8, wherein the ducting system includes at least one duct having an inlet positioned near one or more of the plurality of heat generating devices in the rack, and wherein the step of collecting heat further comprises collecting heat from one or more of the plurality of heat generating devices through the inlet of the at least one duct.

10. The method according to claim 8, wherein the room includes a plurality of racks, each rack housing one or more heat generating components, wherein the ducting system includes at least one duct per rack, said ducts having inlets positioned near at least one of the one or more heat generating devices in each rack, and wherein the step of collecting heat further comprises collecting heat from the one or more heat generating device trough to inlets of the ducts.

11. The method according to claim 5, further comprising:

controlling the flow of heated cooling fluid delivered to heat exchanger and the secondary generator to thereby control the heat supplied to the secondary generator for use in to secondary desorption process.

12. A cooling system for cooling racks housing a plurality of heat generating devices in a room the system comprising:

a multi-effect absorption device for cooling and supplying cooling fluid to the racks, the absorption device having a primary generator, a secondary generator, and an evaporator;

a primary heat source for supplying heat to the primary generator;

a plenum in fluid communication with the racks for drawing cooling fluid heated by the heat generating devices, said plenum being in fluid communication with a heat exchanger and the secondary generator;

said heat exchanger for exchanging heat between the heated cooling fluid and a refrigerant contained in the evaporator; and wherein the secondary generator is configured to employ heat from to heated cooling fluid in an absorption process of the refrigerant.

13. The system of claim 12, further comprising a controller for controlling the amount of primary heat supplied to the primary generator from the primary heat source.

14. The system of claim 13, further comprising a temperature sensor for measuring the temperature of the heated cooling fluid and wherein the controller is configured to determine and control the amount of primary heat supplied to the primary generator based upon the detected temperature of the heated cooling fluid.

15. The system of claim 14, wherein the plenum further includes a variable output fan and wherein the controller is configured to control the output of the variable output fan in accordance with the temperature of the heated cooling fluid.

16. The cooling system of claim 12, further comprising a duct system in fluid communication with one or more of the racks for drawing heat from the racks and conveying the drawn heat to the plenum.

17. The system of claim 16, wherein the duct system includes at least one duct for each rack, each duct having an inlet near a respective rack and an outlet near the plenum.

18. The system of claim 16, wherein the plenum is configured as part of the duct system and wherein the duct system includes at least one duct for each rack, each duct having an inlet attached to a respective rack and an outlet attached to the heat exchanger.

19. The system of claim 12, further comprising a valve configured to meter flow of the heated cooling fluid between the heat exchanger and the secondary generator.

20. A multi-effect absorption system having an absorbent and a refrigerant for cooling a heat generating device, comprising:

a primary means for desorbing a first amount of the refrigerant from the absorbent;

a primary heat source means for providing a variable amount of heat to the primary generator for use in desorbing the first amount of the refrigerant from the absorbent;

a secondary means for desorbing a second amount of the refrigerant from the absorbent; and means for transferring heat generated by the heat generating device to the secondary means thereby increasing the second amount of refrigerant desorbed by the secondary means and decreasing the amount of beat required from the primary heat source means.

21. The system of claim 20, wherein the multi-effect absorption system is a double-effect double-condenser system having a primary condenser, the system further including means for transferring heat produced by the primary condenser to the secondary means.

22. The system of claim 20, wherein the multi-effect absorption system is a double-effect double-absorber system having a primary absorber, the system further including means for transferring heat produced by the primary absorber to the secondary means.

23. The system of claim 20, wherein multi-effect absorption system is a triple-effect absorption system having a primary absorber and a primary condenser, the system further including means for transferring heat produced by the primary absorber and the primary condenser to the secondary means.

24. The system of claim 20, wherein the means for transferring heat comprises a duct means and a means for exchanging heat between cooling fluid heated by the heat generating device and an evaporator means of the multi-effect absorption system, wherein the duct means includes an inlet positioned near the heat generating device and an outlet positioned near the means for exchanging heat.

25. The system of claim 24, further comprising a plurality of heat generating devices, wherein the duct means comprises a plurality of ducts for transferring the heat generated by the plurality of heat generating devices to the heat exchanger and the secondary means.

26. The system of claim 25, wherein the duct means includes at least one duct associated with each heat generating device.

27. The system of claim 24, further comprising:
means for controlling delivery of cooling fluid heated by the heat generating device to the means for exchanging heat and the secondary means.

28. A computer readable medium on which is embedded one or more computer programs, said one or more computer programs implementing a method for reducing energy consumption in a multi-effect absorption system, said one or more computer programs comprising a set of instructions for:
activating to multi-effect absorption system to provide cooling to a heat generating device, the multi-effect absorption system having a primary generator for a primary desorption process and a secondary generator for a secondary desorption process;
delivering heat from a primary heat source to the primary generator;
cooling a beat generating device with cooling fluid supplied by the multi-effect absorption system;
collecting heat generated by the heat generating device;
transferring the collected heat to the secondary generator for use in the secondary desorption process;
monitoring the amount of collected heat transferred to the secondary generator; and
varying the amount of heat provided from the primary heat source in response to the amount of collected heat transferred to the secondary generator thereby reducing the amount of heat required from the primary heat source and reducing the energy consumption of the absorption system.

29. The computer readable storage medium according to claim 28, wherein the multi-effect absorption system is a double-effect double-condenser system having a primary condenser, wherein the primary condenser dissipates heat, the one or more computer programs further comprising a set of instructions for:
collecting heat dissipated by the primary condenser; and
transferring the collected heat from the primary condenser to the secondary generator for use in the secondary desorption process.

30. The computer readable storage medium according to claim 28, wherein the multi-effect absorption system is a double-effect double-absorber system having a primary absorber, wherein the primary absorber dissipates heat, the one or more computer programs further comprising a set of instructions for:
collecting heat dissipated by the primary absorber; and
transferring the collected heat from the primary absorber to the secondary generator for use in the secondary desorption process.

31. The computer readable storage medium according to claim 28, wherein the multi-effect absorption system is a triple-effect absorption system having a primary absorber and a primary condenser, wherein the primary absorber and the primary condenser dissipate heat, the one or more computer programs further comprising a set of instructions for:
collecting heat dissipated by the primary absorber and the primary condenser; and
transferring the heat collected from the primary absorber and the primary condenser to the secondary generator for use in the secondary desorption process.

32. The computer readable storage medium according to claim 28, wherein the multi-effect absorption system receives cooling fluid heated by the heat generating device, said multi-effect absorption system comprising an evaporator, the one or more computer programs further comprising a set of instructions for:
cooling the heated cooling fluid through heat exchange between a heat exchanger and the evaporator in the multi-effect absorption system; and supplying the cooled cooling fluid to the heat generating device, wherein the heat generating device is housed in a rack.

33. The computer readable storage medium according to claim 28, the one or more computer programs further comprising a set of instructions for:
controlling the flow of heated cooling fluid delivered to a heat exchanger and the secondary generator to thereby control the heat supplied to the secondary generator for use in the secondary desorption process.

* * * * *

UNITED STATES PATENT AND TRADEMARK OFFICE
CERTIFICATE OF CORRECTION

PATENT NO.        : 7,003,966 B2
APPLICATION NO.   : 10/739037
DATED             : February 28, 2006
INVENTOR(S)       : Ratnesh K. Sharma et al.

It is certified that error appears in the above-identified patent and that said Letters Patent is hereby corrected as shown below:

In column 16, line 42, in Claim 2, delete "condenser;" and insert -- condenser, --, therefor.

In column 17, line 4, in Claim 5, delete "die" and insert -- the --, therefor.

In column 17, line 35, in Claim 10, delete "trough to" and insert -- through the --, therefor.

In column 17, line 38, in Claim 11, insert -- the -- before "heat".

In column 17, line 40, in Claim 11, delete "to" and insert -- the --, therefor.

In column 17, line 42, in Claim 12, delete "room" and insert -- room, --, therefor.

In column 17, line 57, in Claim 12, delete "to" and insert -- the --, therefor.

In column 18, line 35, in Claim 20, delete "beat" and insert -- heat --, therefor.

In column 18, line 47, in Claim 23, after "wherein" insert -- the --.

In column 19, line 11, in Claim 28, after "activating" delete "to" and insert -- the --, therefor.

In column 19, line 18, in Claim 28, delete "beat" and insert -- heat --, therefor, Signed and Sealed this Eleventh Day of August, 2009

David J. Kappos
*Director of the United States Patent and Trademark Office*